United States Patent [19]

Yamashita et al.

[11] Patent Number: 5,045,813

[45] Date of Patent: Sep. 3, 1991

[54] SLIP PHASE CONTROL PLL

[75] Inventors: Kazuo Yamashita; Akiharu Inoue; Masahiko Egawa, all of Mitaka, Japan

[73] Assignee: Nihon Musen Kabushiki Kaisha, Tokyo, Japan

[21] Appl. No.: 483,056

[22] Filed: Feb. 21, 1990

[30] Foreign Application Priority Data

Oct. 19, 1989 [JP] Japan .................................. 1-272640
Oct. 24, 1989 [JP] Japan .................................. 1-278203

[51] Int. Cl.$^5$ ......................................... H03L 7/197
[52] U.S. Cl. ..................................... 331/16; 331/1 A; 331/25; 455/260
[58] Field of Search ...................... 331/1 A, 16, 18, 25; 375/120; 455/260

[56] References Cited

U.S. PATENT DOCUMENTS 4,686,488 8/1987 Attenborough .................. 331/16 X

FOREIGN PATENT DOCUMENTS 0272938 12/1987 European Pat. Off.
63-26589 2/1988 Japan .
1575664 7/1977 United Kingdom .

Primary Examiner—David Mis
Attorney, Agent, or Firm—Frishauf, Holtz, Goodman & Woodward

[57] ABSTRACT

A slip phase control phase-locked loop includes a voltage-controlled oscillator for generating a frequency signal, and a binary programmable frequency divider for producing a frequency-divided signal in response to the frequency signal supplied thereto, the binary programmable frequency divider including a 2-scale-factor prescaler, a swallow counter, and a main counter. The phase of the frequency-divided signal is compared with the phase of a reference frequency signal. A phase-compared signal is integrated and the integrated signal is applied to the voltage-controlled oscillator. A D/A converter swallow counter and a D/A converter counter are operable with the binary programmable frequency divider for D/A-converting a signal derived from the frequency signal into a pulse-width-modulated signal corresponding to the phase-compared signal at a present count ranging from 0 to $2^M-1$, where M is a positive integer.

15 Claims, 3 Drawing Sheets

SLIP PHASE CONTROL PLL

BACKGROUND OF THE INVENTION

The present invention relates to a slip phase control phase-locked loop for generating a frequency-controlled output signal.

Analog and digital phase-locked loops (PLL) are widely used as highly-accurate frequency-controlled oscillators in radio communication systems or the like.

One example of a PLL capable of producing an output signal having a high C/N (carrier signal/noise) ratio is a slip phase control PLL disclosed in Japanese Laid-Open Patent Publication No. 63(1988)-26589.

The disclosed slip phase control PLL has a voltage-controlled oscillator (VCO), a phase comparator, a low-pass filter (LPF), and a programmable frequency divider which comprises a pulse-swallow-type 2-scale-factor prescaler, a swallow counter, and a main counter. The slip phase control PLL also includes a sawtooth generator for dividing a variable division ratio by $(n+q)$ (q is an integer other than 0) in each period T and generating a sawtooth wave having a period T. The output signal of the sawtooth generator is added or subtracted by the low-pass filter so that a slip phase waveform of the output signal from the phase comparator will be canceled out.

With the above arrangement, since no ripples are produced in a control voltage, particularly a low voltage, applied to the variable capacitor or the like of the VCO, the noise figure (NF) of the VCO is increased, and the VCO can produce an output signal of a high C/N ratio.

In the programmable frequency divider, when the 2-scale-factor prescaler has division ratios of $2^M$ and $2^M+1$, the swallow counter counts m pulses according to a preset number m, and the main counter divides the input frequency by n according to a preset number n. During an m-counting period in which n pulses are being counted by the main counter, the 2-scale-factor prescaler divides the input frequency by $2^M+1$, and during the remaining (n−m)-counting period, the 2-scale-factor prescaler divides the input frequency by $2^M$.

The total division ratio q of the programmable frequency divider is given by:

$$q = m \times (2^M+1) + (n-m) \times 2^M = m + 2^M \times n \quad (1)$$

The slip phase control PLL can control an oscillation frequency highly accurately, but is relatively complex in arrangement.

The preset number m varies from 0 to $2^M-1$ in order to generate a signal to be supplied to the LPF for canceling out the slip phase waveform. Based on this fact, efforts to reduce the circuit scale are directed to the addition of a D/A converter which counts output pulses of the 2-scale-factor prescaler during an interval in which the division ratio of the 2-scale-factor prescaler is of a constant value of $2^M$.

However, the D/A converter has a D/A conversion range which is limited to a pulse count that ranges from 0 to $n-2^M$, and hence cannot achieve a multiple-frequency output capability. The above drawbacks should be eliminated in view of demands for highly accurate frequency control, reduced circuit scales, and a reduced number of signal processing cycles.

SUMMARY OF THE INVENTION

It is a general object of the present invention to provide a slip phase control PLL which can generate a high-frequency local oscillation signal or transmitted oscillation signal at successive intervals or steps in a radio transmitter/receiver or the like.

Another object of the present invention is to provide a slip phase control PLL which has a relatively simple circuit arrangement to reduce a circuit scale and a signal processing scale and which controls an oscillated frequency highly accurately.

Still another object of the present invention is to provide a slip phase control phase-locked loop comprising a voltage-controlled oscillator for generating a frequency signal, binary programmable frequency dividing means for producing a frequency-divided signal in response to the frequency signal supplied thereto, the binary programmable frequency dividing means including a 2-scale-factor prescaler, a swallow counter, and a main counter, phase-comparing/ integrating means for comparing the phase of the frequency-divided signal with the phase of a reference frequency signal, integrating a phase-compared signal, and applying the integrated signal to the voltage-controlled oscillator, and D/A converting means having a D/A converter swallow counter and a D/A converter counter and operable with the binary programmable frequency dividing means for D/A-converting a signal derived from the frequency signal into a pulse-width-modulated signal corresponding to the phase-compared signal at a preset count ranging from 0 to $2^M-1$.

Yet another object of the present invention is to provide a slip phase control phase-locked loop comprising a voltage-controlled oscillator for generating a frequency signal, binary programmable frequency dividing means for producing a frequency-divided signal in response to the frequency signal supplied thereto, the binary programmable frequency dividing means including a 2-scale-factor prescaler, a swallow counter, and a main counter, phase-comparing/ integrating means for comparing the phase of the frequencydivided signal with the phase of a reference frequency signal, integrating a phase-compared signal, and applying the integrated signal to the voltage-controlled oscillator, and a D/A converter counter operable with the main counter for operating the swallow counter to count pulses to produce a pulse-width-modulated signal corresponding to the phase-compared signal after the counter has finished counting pulses, and for adding the pulse-width-modulated signal to the phase-compared signal.

A further object of the present invention is to provide a slip phase control phase-locked loop comprising a voltage-controlled oscillator for generating a frequency signal, binary programmable frequency dividing means for producing a frequency-divided signal in response to the frequency signal supplied thereto, the binary programmable frequency dividing means including a 2-scale-factor prescaler, a swallow counter, and a main counter, phase-comparing/ integrating means for comparing the phase of the frequency-divided signal with the phase of a reference frequency signal, integrating a phase-compared signal, and applying the integrated signal to the voltage-controlled oscillator, and a D/A converter counter operable with the swallow counter for operating the main counter to count pulses to produce a pulse-width-modulated signal corresponding to the phase-compared signal after the swallow counter has finished counting pulses, and for adding the pulse-width-modulated signal to the phase-compared signal.

The above and other objects, features and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
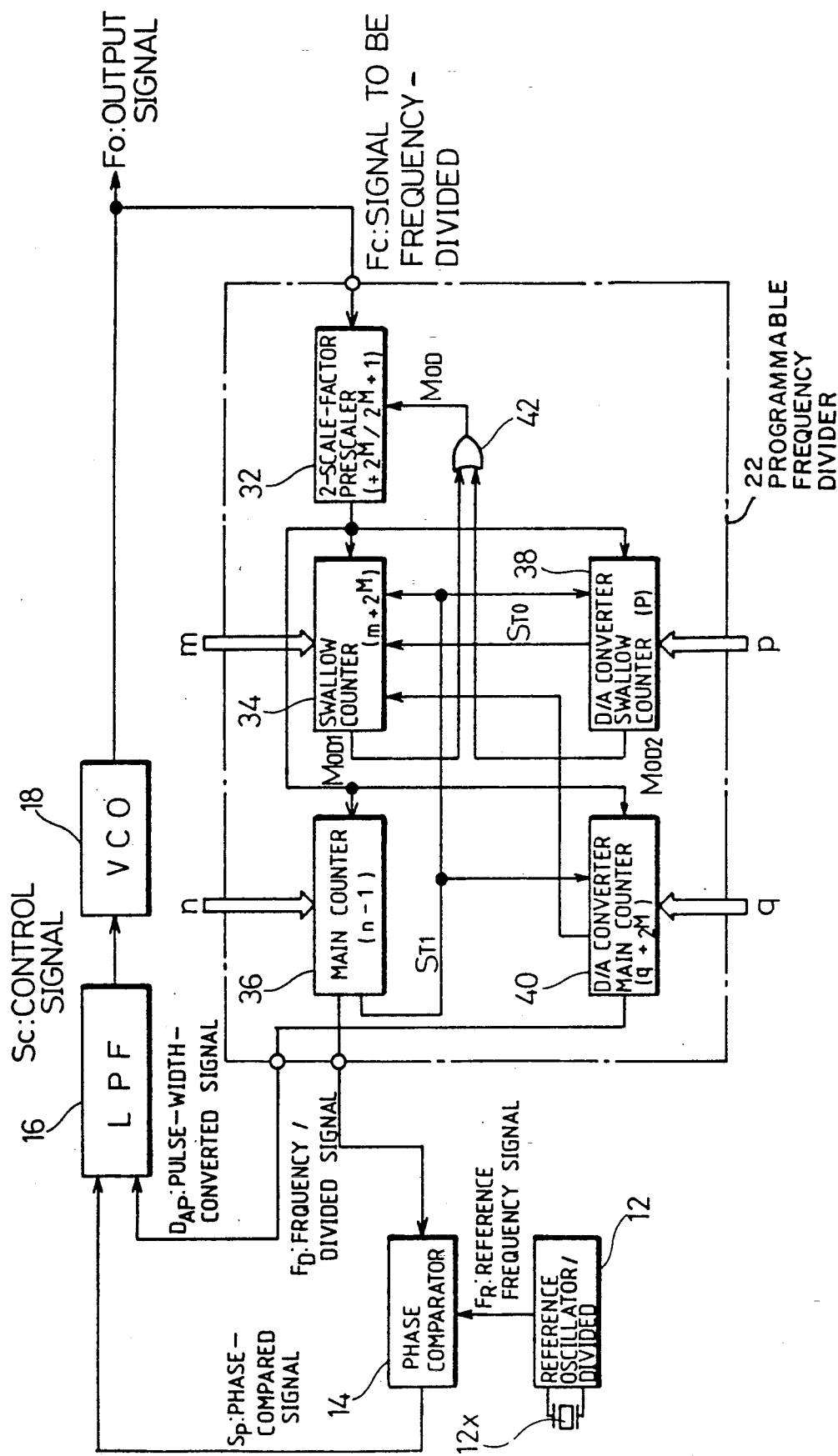
FIG. 1 is a block diagram of a slip phase control PLL according to an embodiment of the present invention.

FIG. 1 shows a slip phase control PLL according to an embodiment of the present invention. The slip phase control PLL shown in FIG. 1 has a reference oscillator/divider 12, a quartz oscillator 12x, a phase comparator 14, a low-pass filter 16, a voltage-controlled oscillator (VCO) 18, and a programmable frequency divider 22.

When the VCO 18 is pulled in and locked in, it produces an output signal $F_O$.

More specifically, a reference frequency signal $F_R$ is produced by the reference oscillator/divider 12 and supplied to the phase comparator 14.

A signal $F_C$ which is to be frequency-divided is supplied from the VCO 18 to the programmable frequency divider 22, which applies a frequency-divided signal $F_D$ having the same frequency as that of the reference frequency signal $F_R$ to the phase comparator 14.

The phase comparator 14 supplies a phase-compared signal $S_p$ to the low-pass filter 16, which applies an integrated control signal $S_C$ to the VCO 18. The programmable frequency divider 22 supplies the low-pass filter 16 with a pulse-width converted signal $D_{AP}$ which corresponds to a phase slip and a phase shift of the phase-compared signal $S_p$. At this time, the pulse-width converted signal $DA_p$ and the phase-compared signal $S_p$ are supplied to the low-pass filter 16 such that they cancel out each other. The control signal $S_C$ produced by the low-pass filter 16 is in the form of a DC voltage (current) which therefore has reduced ripples.

The above basic mode of operation is known from Japanese Laid-Open Patent Publication No. 63(1988)-26589, for example, and will not be described in further detail.

The programmable frequency divider 22, which is an essential feature of the present invention, will now be described below.

The programmable frequency divider 22 has a 2-scale-factor prescaler 32 which is supplied with the signal $F_C$ to be frequency-divided and which has selectable division ratios, a swallow counter 34, a main counter 36, a D/A converter swallow counter 38, a D/A converter main counter 40, and a gate 42.

The frequency-divided signal $F_D$ and the pulse-width converted signal $D_{AP}$ are generated by the programmable frequency divider 22 as follows:

Denoted at $C_K$ is an intermediate frequency-divided clock signal, $S_{T1}$ a starting signal for the programmable frequency divider 22, $S_{T2}$ and $S_{TO}$ starting and disabling signals, respectively, for the swallow counter 34, $M_{OD}$ a division control signal for the 2-scale-factor prescaler 32, $M_{OD1}$ an output signal from the swallow counter 34, $M_{OD2}$ an output signal from the D/A converter swallow counter 38, m and n division ratio setting codes (numbers), and p and q D/A conversion setting codes (numbers).

The swallow counter 34 counts $(m+2^M)$ pulses of the intermediate frequency-divided clock signal $C_K$ according to the division ratio setting code m. The main counter 36 counts $(n-1)$ pulses of the clock signal $C_K$ according to the division ratio setting code n. The D/A converter swallow counter 38 counts p pulses of the clock pulse $C_K$ according to the D/A conversion setting code p. The D/A converter main counter 40 counts $(q+2^M)$ pulses and also counts the clock signal $C_K$ according to the D/A conversion setting code q.

The 2-scale-factor prescaler 32 divides the frequency of the signal $F_C$ by $2^M+1$ during an interval in which the division control signal $M_{OD}$ is of a high (H) level, and divides the frequency of the signal $F_C$ by $2^M$ during an interval in which the division control signal $M_{OD}$ is of a low (L) level. The intermediate frequency-divided clock signal $C_K$ is produced by the prescaler 32 when the signal $F_C$ is frequency-divided in this manner.

The main counter 36 frequency-divides the intermediate frequency-divided clock signal $C_K$ by $n-1$, thus producing the frequency-divided signal $F_D$, and delivers the starting signal $S_{T1}$ each time it counts $(n-1)$ pulses.

In response to the starting signal $S_{T1}$, the D/A converter main counter 40 renders the pulse-width converted signal $D_{AP}$ high in level during an interval in which it counts $(q+2^M)$ pulses of the intermediate frequency-divided clock signal $C_K$. After having counted the $(q+2^M)$ pulses, the D/A converter main counter 40 delivers the starting signal $S_{T2}$. The D/A converter main counter 40 keeps the pulse-width converted signal $D_{AP}$ low in level until the next starting signal $S_{T1}$ is applied thereto.

The D/A converter swallow counter 38 is responsive to the starting signal $S_{T1}$ for rendering the output signal $M_{OD2}$ high in level during an interval in which it counts p pulses of the intermediate frequency-divided clock signal $C_K$. After having counted the p pulses, the D/A converter swallow counter 38 generates the disabling signal $S_{TO}$. The D/A converter swallow counter 38 maintains the output signal $M_{OD2}$ at a low level until it is supplied with the next starting signal $S_{T1}$.

When the starting signal $S_{T1}$ is supplied, the swallow counter 34 counts p pulses of the intermediate frequency-divided clock signal $C_K$ while the D/A converter swallow counter 38 is counting the p pulses. After the swallow counter 34 has been disabled by the disabling signal $S_{TO}$, it counts again the clock signal $C_K$ when supplied with the starting signal $S_{T2}$. While the swallow counter 34 is counting the remaining $(m+2^M-p)$ pulses of the clock signal $C_K$, it keeps the output signal $M_{OD1}$ high in level. The swallow counter 34 keeps the output signal $M_{OD1}$ low in level until it is supplied with the next starting signal $S_{T2}$.

The gate 42 renders the division control signal $M_{OD}$ high in level when either one of the supplied output signals $M_{OD1}$, $M_{OD2}$ is high in level. The gate 42 keeps the division control signal $M_{OD}$ low in level only when both output signals $M_{OD1}$, $M_{OD2}$ are low in level.

The total division ratio d of the programmable frequency divider 22 is expressed by:

$$d = (2^M+1) \times (m+2^M) + 2^M \times \{n-1-(m+2^M)\} = m + 2^M \times n \quad (2)$$

The number e of counted pulses of the pulse-width converted signal $D_{AP}$ is given by:

$$e = (2^M+1) \times p + 2^M \times (q+2^M-p) = p + 2^M \times q + 2^{2M} \quad (3)$$

The train of pulses from the D/A converter main counter 40 has a pulse width ratio w as follows:

$$w = \frac{p + 2^M \times q + 2^{2M}}{m + 2^M \times n} \quad (4)$$

When the pulse train is averaged, there is obtained a D/A-converted voltage (or current) which is proportional to $p + 2^M \times q + 2^{2M}$, i.e., the pulse-width converted signal $D_{AP}$.

The codes m, n, p, q are subject to the following limitations:

$$0 \leq p < 2^M, \ 0 \leq m < 2^M, \ q + 2^{M+1} < n \quad (5)$$

For example, when M=5 (i.e., the division ratios of the 2-scale-factor prescaler 32 are 32, 33), if the D/A conversion setting code q is of 5 bits, then since the D/A conversion setting code p is also of 5 bits, $$0 \leq p + 2^5 \times q < 2^{10} \quad (6)$$

Therefore, it is possible to effect a D/A conversion process with the accuracy of 1024 points, i.e., 10 bits.

Inasmuch as there can be obtained a highly accurate D/A converted voltage (or current) corresponding to a phase slip and a phase shift during a time period T in which the signal $F_C$ is being frequency-divided by $(n \cdot 2^M + m)$, the VCO 18 can produce a highly accurate output signal $F_O$ which has a high C/N ratio and a good NF.

The slip phase control PLL of the aforesaid construction is of a relatively simple arrangement for a reduced circuit scale and signal processing scale, and can control an oscillation frequency with high accuracy.

Figure 2:
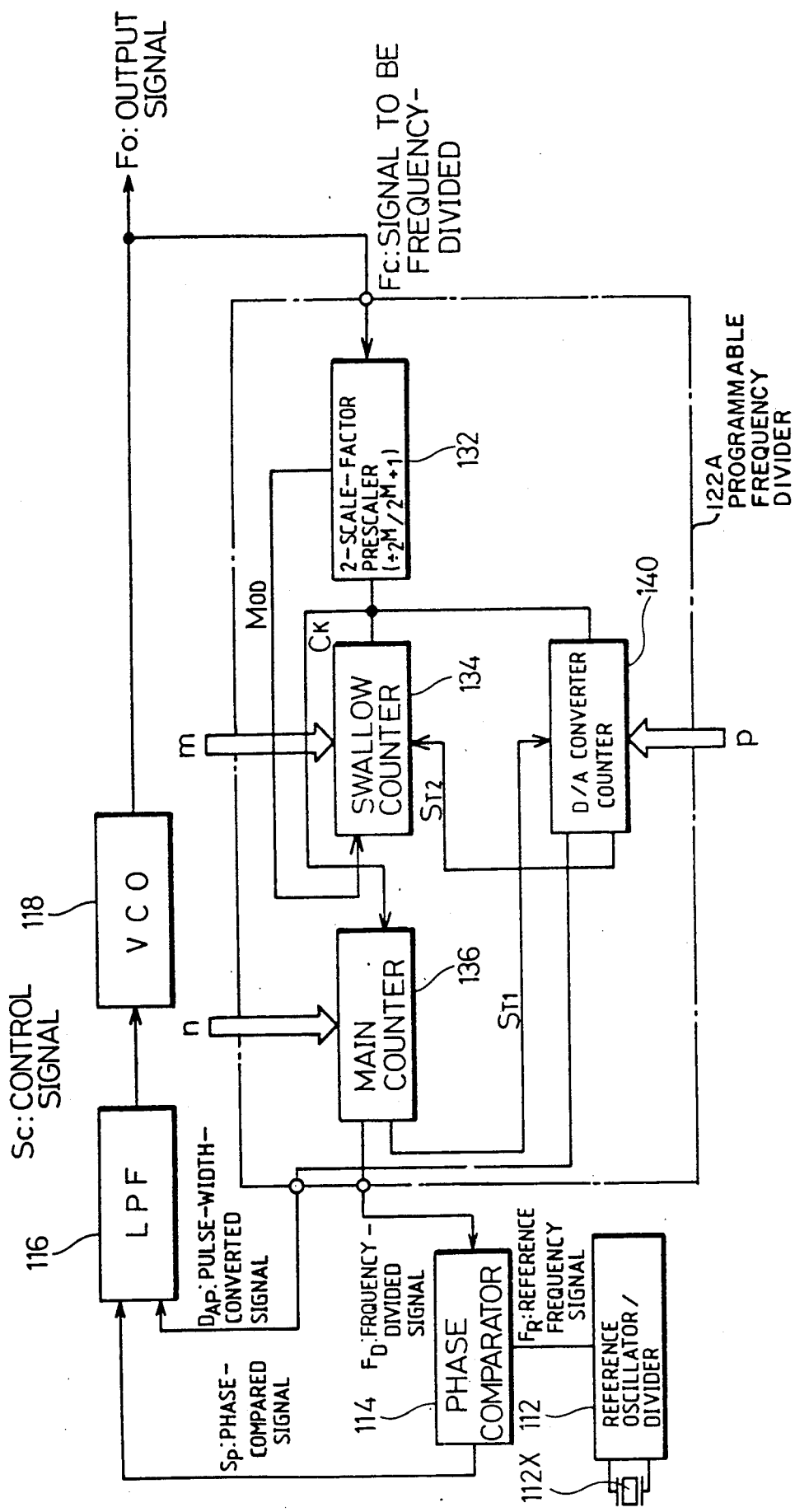
FIG. 2 is a block diagram of a slip phase control PLL according to another embodiment of the present invention.

FIG. 2 shows a slip phase control PLL according to another embodiment of the present invention. The slip phase control PLL shown in FIG. 2 has a reference oscillator/divider 112, a quartz oscillator 112x, a phase comparator 114, a low-pass filter 116, a voltage-controlled oscillator (VCO) 118, and a programmable frequency divider 122A.

When the VCO 118 is pulled in and locked in, it produces an output signal $F_O$. The operation of the reference oscillator/divider 112, the quartz oscillator 112x, the phase comparator 114, the low-pass filter 116, and the VCO 118 is the same as that of those shown in FIG. 1, and will not be described in detail.

The programmable frequency divider 122A, which is an essential feature of the present invention, will now be described below.

The programmable frequency divider 122A has a 2-scale-factor prescaler 132 which is supplied with the signal $F_C$ to be frequency-divided and which has selectable division ratios, a swallow counter 134, a main counter 136, and a D/A converter counter 140.

The frequency-divided signal $F_D$ and the pulse-width converted signal $D_{AP}$ are generated by the programmable frequency divider 122A as follows:

Denoted at $C_K$ is an intermediate frequency-divided clock signal, $S_{T1}$ a starting signal for the programmable frequency divider 122A, $S_{T2}$ a starting signal for the swallow counter 134, $M_{OD}$ a division control signal for the 2-scale-factor prescaler 132, m and n division ratio setting codes (numbers), and p a D/A conversion setting code (number).

The 2-scale-factor prescaler 132 divides the frequency of the signal $F_C$ by $2^M+1$ during an interval in which the division control signal $M_{OD}$ is of a high (H) level, and divides the frequency of the signal $F_C$ by $2^M$ during an interval in which the division control signal $M_{OD}$ is of a low (L) level. The intermediate frequency-divided clock signal $C_K$ is produced by the prescaler 32 when the signal $F_C$ is frequency-divided in this manner.

When the starting signal $S_{T2}$ is supplied, the swallow counter 134 keeps the division control signal $M_{OD}$ high in level while it is counting m pulses of the intermediate frequency-divided clock signal $C_K$. The swallow counter 134 then keeps the division control signal $M_{OD}$ low in level until the next starting signal $S_{T2}$ is supplied.

The main counter 136 frequency-divides the intermediate frequency-divided clock signal $C_K$ by n, thus producing the frequency-divided signal $F_D$, and delivers the starting signal $S_{T1}$ each time it counts n pulses.

In response to the starting signal $S_{T1}$, the D/A converter counter 140 renders the pulse-width converted signal $D_{AP}$ high in level during an interval in which it counts p pulses of the intermediate frequency-divided clock signal $C_K$. After having counted the p pulses, the D/A converter counter 140 delivers the starting signal $S_{T2}$. The D/A converter counter 140 keeps the pulse-width converted signal $D_{AP}$ low in level until the next starting signal $S_{T1}$ is applied thereto.

Figure 3:
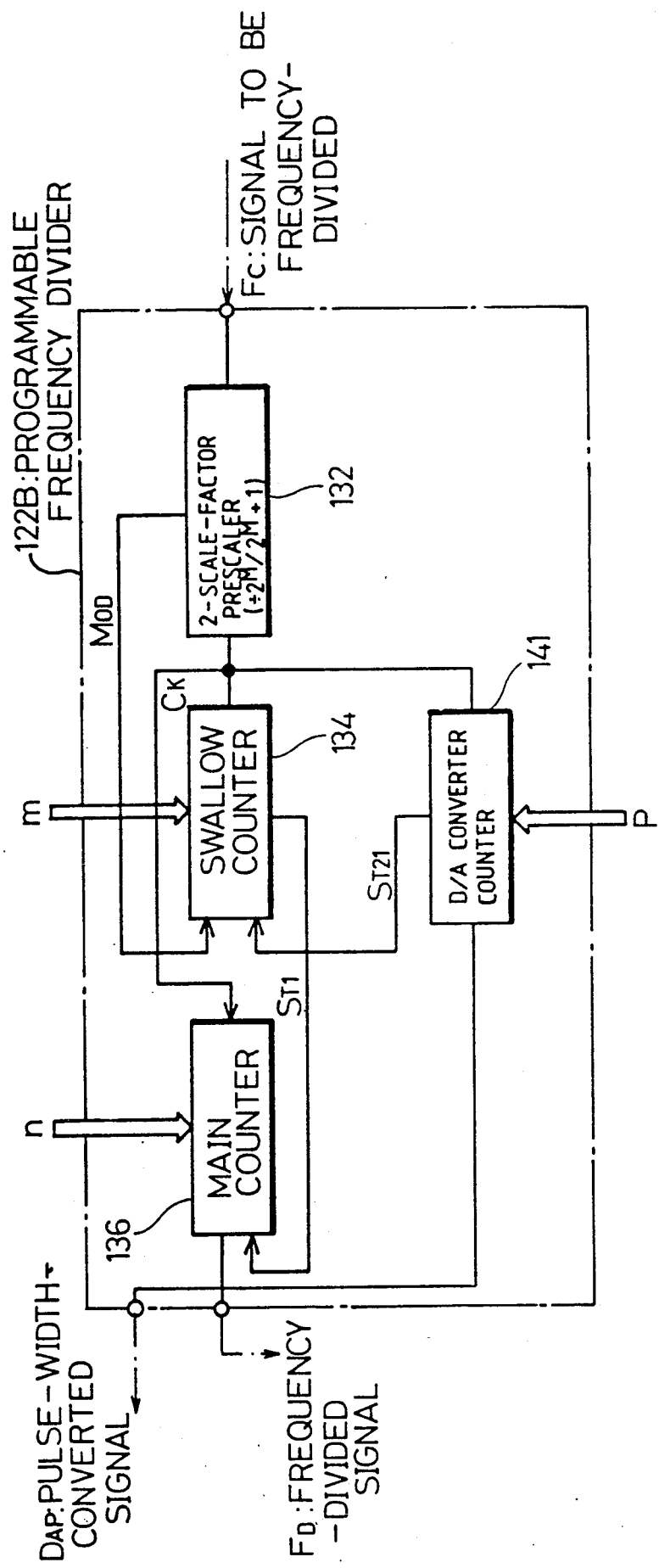
FIG. 3 is a block diagram of another programmable frequency divider unit for use in the slip phase control PLL shown in FIG. 2.

FIG. 3 shows another programmable frequency divider 122B which can be used in place of the programmable frequency divider 122A in the slip phase control PLL illustrated in FIG. 2.

The programmable frequency divider 122B is essentially the same as the programmable frequency divider 122A except that the starting signal $S_{T1}$ is supplied to the swallow counter 134 and another starting signal $S_{T21}$ is supplied to a D/A converter counter 141.

Denoted at $C_K$ is an intermediate frequency-divided clock signal, $S_{T1}$ a starting signal for the programmable frequency divider 122B, $S_{T21}$ a starting signal for the D/A converter counter 141, $M_{OD}$ a division control signal for the 2-scale-factor prescaler 132, m and n division ratio setting codes (numbers), and p a D/A conversion setting code (number).

The 2-scale-factor prescaler 132 divides the frequency of the signal $F_C$ by $2^M+1$ during an interval in which the division control signal $M_{OD}$ is of a high (H) level, and divides the frequency of the signal $F_C$ by $2^M$ during an interval in which the division control signal $M_{OD}$ is of a low (L) level. The intermediate frequency-divided clock signal $C_K$ is produced by the prescaler 32 when the signal $F_C$ is frequency-divided in this manner.

When the starting signal $S_{T1}$ is supplied, the swallow counter 134 keeps the division control signal $M_{OD}$ high in level while it is counting m pulses of the intermediate frequency-divided clock signal $C_K$. The swallow counter 134 generates the starting signal $S_{T21}$ when it completes the counting of the m pulses of the clock signal $C_K$. The swallow counter 134 then keeps the division control signal $M_{OD}$ low in level until the next starting signal $S_{TI}$ is supplied.

The main counter 136 frequency-divides the intermediate frequency-divided clock signal $C_K$ by n, thus producing the frequency-divided signal $F_D$, and delivers the starting signal $S_{TI}$ each time it counts n pulses.

In response to the starting signal $S_{T21}$, the D/A converter counter 141 renders the pulse-width converted signal $D_{AP}$ high in level during an interval in which it counts p pulses of the intermediate frequency-divided clock signal $C_K$. The D/A converter counter 141 then keeps the pulse-width converted signal $D_{AP}$ low in level until the next starting signal $S_{T21}$ is applied thereto.

The total division ratio q'' of the programmable frequency dividers 122A, 122B is expressed by:

$$q'' = (2^M+1) \times m + 2^M \times (n-m) = m + 2^M \times n \quad (7)$$

The number e of counted pulses of the pulseduration converted signal $D_{AP}$ is given by $e = 2^M \times p$:

The train of pulses from the D/A converter counter has a pulse duration ratio d as follows:

$$d = \frac{2^M}{m + 2^M \times n} \times p \quad (8)$$

When the pulse train is averaged, there is obtained a D/A-converted voltage (or current) which is proportional to p, i.e., the pulse-width converted signal $D_{AP}$.

Since the relationship $n \geq 2^{M+1} + p$ must be satisfied in order to obtain a continuously variable division ratio, the division ratio q which is continuously variable is given by:

$$q \geq 2^M \times (2^M \times p) = 2^{M+1} + 2^M \times p \quad (9)$$

In the range of $0 \leq p \leq q - 2^M$, there can be obtained a highly accurate averaged D/A converted voltage (or current), i.e., the pulse-width converted signal $D_{AP}$, which is proportional to the D/A conversion setting code (number) p and inversely proportional to $m + 2^M \times n$, and hence the VCO 118 can produce a highly accurate output signal $F_O$ which has a high C/N ratio and a good NF.

As can be understood from the above description, the D/A converter counter produces a D/A-converted signal which is proportional to the pulse count and inversely proportional to the total division ratio, and the total division ratio is controlled by the swallow counter and the main counter. The limitation which the successive division ratios are subject to is $2^{M+1}$ or higher, and the input signal can be frequency-divided by n according to the preset number n for the main counter without any special addition or subtraction processes.

The slip phase control PLL according to the present invention is relatively simple in arrangement for highly accurately canceling out a slip phase waveform of the phasecompared output signal, which is applied to the VCO to control the oscillation frequency with a high C/N ratio.

Although certain preferred embodiments have been shown and described, it should be understood that many changes and modifications may be made therein without departing from the scope of the appended claims.

What is claimed is:

1. A slip phase control phase-locked loop comprising:
a voltage-controlled oscillator for generating a frequency signal;
binary programmable frequency dividing means for receiving said frequency signal and for producing a frequency-divided signal in response to said frequency signal supplied thereto, said binary programmable frequency dividing means including a 2-scale-factor prescaler, a swallow counter, and a main counter;
phase-comparing/integrating means for comparing phase of said frequency-divided signal with the phase of a reference frequency signal and producing a phase-compared signal, said phase-comparing/integrating means further including means for integrating said phase-compared signal and producing an integrated signal, and means for applying the integrated signal to said voltage-controlled oscillator; and
D/A converting means having a D/A converter swallow counter and a D/A converter main counter and operable with said binary programmable frequency dividing means for D/A-converting a signal derived from said frequency signal into a pulse-width-modulated signal corresponding to said phase-compared signal at a preset count ranging from 0 to $2^M - 1$, where M is a positive integer.

2. The slip phase control phase-locked loop of claim 1, wherein said swallow counter and said main counter of said binary programmable frequency dividing means are both coupled to receive an output of said 2-scale-factor prescaler of said binary programmable frequency dividing means.

3. The slip phase control phase-locked loop of claim 2, wherein said D/A converter swallow counter and said D/A converter main counter are both coupled to receive an output of said 2-scale-factor prescaler of said binary programmable frequency dividing means.

4. The slip phase control phase-locked loop of claim 5, wherein said frequency-divided signal is output from said main counter of said binary programmable frequency dividing means.

5. The slip phase control phase-locked loop of claim 2, wherein said frequency-divided signal is output from said main counter of said binary programmable frequency dividing means.

6. A slip phase control phase-locked loop comprising:
a voltage-controlled oscillator for generating a frequency signal;
binary programmable frequency dividing means for receiving said frequency signal and for producing a frequency-divided signal in response to said frequency signal supplied thereto, said binary programmable frequency dividing means including a 2-scale-factor prescaler, a swallow counter, and a main counter;
phase-comparing/integrating means for comparing the phase of said frequency-divided signal with the phase of a reference frequency signal and producing a phase-compared signal, said phase-comparing/integrating means further including means for integrating said phase-compared signal and producing an integrated signal, and means for applying the integrated signal to said voltage-controlled oscillator; and
a D/A converter counter operable with said main counter for operating said swallow counter to count pulses to produce a pulse-width-modulated signal corresponding to said phase-compared signal after said counter has finished counting pulses, and for adding said pulse-width-modulated signal to said phase-compared signal.

7. The slip phase control phase-locked loop of claim 6, wherein said swallow counter and said main counter of said binary programmable frequency dividing means are both coupled to receive an output of said 2-scale-factor prescaler of said binary programmable frequency dividing means.

8. The slip phase control phase-locked loop of claim 7, wherein said D/A converter counter is coupled to receive an output of said 2-scale-factor prescaler.

9. The slip phase control phase-locked loop of claim 8, wherein said frequency-divided signal is output from said main counter of said binary programmable frequency dividing means.

10. The slip phase control phase-locked loop of claim 7, wherein said frequency-divided signal is output from said main counter of said binary programmable frequency dividing means.

11. A slip phase control phase-locked loop comprising:
a voltage-controlled oscillator for generating a frequency signal;
binary programmable frequency dividing means for receiving said frequency signal and for producing a frequency-divided signal in response to said frequency signal supplied thereto, said binary programmable frequency dividing means including a 2-scale-factor prescaler, a swallow counter, and a main counter;
phase-comparing/integrating means for comparing the phase of said frequency-divided signal with the phase of a reference frequency signal and producing a phase-compared signal, said phase-comparing/integrating means further including means for integrating a phase-compared signal and producing an integrated signal, and means for applying the integrated signal to said voltage-controlled oscillator; and
a D/A converter counter operable with said swallow counter for operating said main counter to count pulses to produce a pulse-width-modulated signal corresponding to said phase-compared signal after said swallow counter has finished counting pulses, and for adding said pulse-width-modulated signal to said phase-compared signal.

12. The slip phase control phase-locked loop of claim 11, wherein said swallow counter and said main counter of said binary programmable frequency dividing means are both coupled to receive an output of said 2-scale-factor prescaler of said binary programmable frequency dividing means.

13. The slip phase control phase-locked loop of claim 12, wherein said D/A converter counter is coupled to receive an output of said 2-scale-factor prescaler.

14. The slip phase control phase-locked loop of claim 13, wherein said frequency-divided signal is output from said main counter of said binary programmable frequency dividing means.

15. The slip phase control phase-locked loop of claim 12, wherein said frequency-divided signal is output from said main counter of said binary programmable frequency dividing means.

* * * * *

UNITED STATES PATENT AND TRADEMARK OFFICE
CERTIFICATE OF CORRECTION

PATENT NO. : 5,045,813

DATED : September 3, 1991

INVENTOR(S) : YAMASHITA et al

It is certified that error appears in the above-identified patent and that said Letters Patent is hereby corrected as shown below:

Column 8, lines 38-39 (Claim 4):

Change "claim 5" to read --claim 3--.

Signed and Sealed this

Twenty-seventh Day of April, 1993

Attest:

MICHAEL K. KIRK

*Attesting Officer*      Acting Commissioner of Patents and Trademarks